United States Patent
Hekstra et al.

(10) Patent No.: US 8,566,683 B2
(45) Date of Patent: Oct. 22, 2013

(54) POWER-REDUCED PRELIMINARY DECODED BITS IN VITERBI DECODERS

(75) Inventors: Andries Pieter Hekstra, Eindhoven (NL); Weihua Tang, Eindhoven (NL)

(73) Assignee: NXP, B.V., Eindhoven (NL)

(*) Notice: Subject to any disclaimer, the term of this patent is extended or adjusted under 35 U.S.C. 154(b) by 493 days.

(21) Appl. No.: 12/647,885

(22) Filed: Dec. 28, 2009

(65) Prior Publication Data
US 2011/0161787 A1    Jun. 30, 2011

(51) Int. Cl.
*H03M 13/03* (2006.01)

(52) U.S. Cl.
USPC .......................................................... 714/795

(58) Field of Classification Search
USPC .......................................................... 714/795
See application file for complete search history.

(56) References Cited

U.S. PATENT DOCUMENTS

| | | | |
|---|---|---|---|
| 7,127,667 B2 * | 10/2006 | Chen et al. | 714/795 |
| 7,162,675 B2 * | 1/2007 | Das et al. | 714/751 |
| 7,581,160 B2 * | 8/2009 | Chen et al. | 714/795 |
| 7,656,959 B2 * | 2/2010 | Haratsch | 375/262 |
| 7,669,110 B2 * | 2/2010 | Graef | 714/795 |
| 7,752,531 B2 * | 7/2010 | Patapoutian et al. | 714/795 |
| 7,962,841 B2 * | 6/2011 | Rho et al. | 714/796 |
| 8,375,281 B2 * | 2/2013 | Graef | 714/795 |
| 8,433,975 B2 * | 4/2013 | Hekstra et al. | 714/760 |

OTHER PUBLICATIONS

C. M. Rader, "Memory management in a Viterbi decoder," IEEE Trans. Commun., vol. COM-29, pp. 1399-1401, Sep. 1981.
R. Cypher, et al., "Generalized Trace Back Techniques for Survivor Memory Management in the Viterbi Algorithm," Journam of VLSI Signal Processing, No. 1, pp. 85-94, Jan. 1993.
M. Steinert, et al., "Power Consumption Optimization for Low Latency Viterbi Decoder," Circuits and Systems, pp. II 377-II 380, ISCAS, 2004.
T. K. Moon, "Error Correction Coding: Mathematical Methods and Algorithms," John Wiley and Sons, Inc., 2005, pp. 451-534.
C. C. Lin, et al., "Design of a Power-Reduction Viterbi Decoder for WLAN Applications," IEEE Transactions on Circuits and Systems-I: Regular Papers, Vol. 52, No. 6, Jun. 2005.
W. L. Su, et al., "A low power pulsed-edge triggered latch for the survivor path unit in a Viterbi decoder," Electronics Circuits and Systems, 13th IEEE International Conference on, pp. 553-556, 2006.
F. Sun, et al., "Low power state-parallel relaxed adaptive Viterbi decoder," IEEE Trans. on Circ. and Syst., vol. 54, No. 5 pp. 1060-1068, May 2007.
J. Jin, et al., "Low-Power Limited-Search Parallel State Viterbi DecoderImplementation Based on Scarce State Transition," IEEE Trans. on VLSI vol. 15, No. 10, pp. 1172-1176, Oct. 2007.
Extended European Search Report for EP Patent Application No. 10196104.3, European Patent Office, Feb. 17, 2011.

* cited by examiner

*Primary Examiner* — Amine Riad

(57) ABSTRACT

Various embodiments relate to a storage unit and a related method in a Viterbi decoder for decoding a binary convolutional code with power efficiency. A storage unit for storing survivor paths may use a register exchange method to append additional information received from an add-compare-select unit onto the end of the survivor path. An exemplary method produces a prediction path after a specified depth in the survivor path processing history and subtracts the prediction path from the survivor path. This may cause a majority of bits that comprise the survivor path to be converted to a low-energy bit, such as a logical "0". During subsequent copies of a differential survivor path using the register exchange method, less energy is consumed when copying the entire survivor path, as a majority of the bits in the survivor paths are a logical "0".

28 Claims, 6 Drawing Sheets

POWER-REDUCED PRELIMINARY DECODED BITS IN VITERBI DECODERS

TECHNICAL FIELD

Embodiments disclosed herein relate generally to convolutional codes and Viterbi decoders.

BACKGROUND

Modern communications systems are required to transmit data at high rates. Due to the high transfer rates, many communications systems employ error-control code to enhance system performance. For example, a circuit may regularly use convolutional codes for error correction to achieve reliable data transfer, such as in wireless communications and digital video. Convolutional codes are popular for their error correction capacity and reasonable coding simplicity. Convolutional codes are regularly used in digital communications standards, such as, for example, DVB-T (Digital Video Broadcast—Terrestrial) and ISDB-T (Integrated Service Digital Broadcasting—Terrestrial).

The Viterbi algorithm may be one of the best algorithms for decoding convolutional codes, especially with constrained resources, which may include factors like a small amount of memory or limited area on an integrated circuit (IC) chip; however, the Viterbi algorithm is computationally intensive. The Viterbi algorithm, a dynamic programming algorithm finding the most likely sequence of hidden states (the Viterbi path) that results in a sequence of observed events, is usually used to decode convolutional codes in the form of a Viterbi decoder. The Viterbi decoder is usually a hardware implementation that takes one or more input bits and outputs decoded bits. As the data rate requirements increase in modern wireless applications, system complexity and power consumption issues involved with the Viterbi algorithm and the Viterbi decoder become greater issues.

Of the components that constitute a Viterbi decoder, the Add-Compare-Select Unit (ACSU) and Survivor Path Storage Unit (SPSU) usually consume the most power. For example, the ACSU may consume a great amount of power due to calculations relating to updating branch metrics at a high clock frequency, whereas the SPSU may have high power consumption due to a large number of memory accesses and rewrites. However, the power consumption of the SPSU depends greatly upon the method the SPSU employs, as there are multiple methods to implement the SPSU's function of constructing the Viterbi path. For example, the trace back (TB) method for the SPSU stores a trace back bit to indicate which of a plurality of incoming previous states for a given state was selected as the optimal branch in the add-compare-select (ACS) operation performed by the ACSU. Another method, the register exchange (RE) method, keeps multiple sets of Viterbi paths, which may also be known as survivor paths, in the SPSU and appends new sequence information onto the stored survivor path. The SPSU appends the stored survivor path by copying a "new" survivor path from an "old" survivor path. The new and old survivor paths are identical, except that the new survivor path extends the old survivor path with the new bit corresponding to the chosen previous state and may discard the oldest bit in the survivor path if the survivor path is of a discrete length.

The register exchange (RE) method for the SPSU has a number of advantages over the trace back (TB) method, most notably its high speed, simple architecture and control, and low latency. However, a major drawback to the RE method is its high power consumption, which is due to the copying of entire old survivor paths to create new survivor paths for each decoded bit received by the SPSU. Due to the high power consumption associated with the RE method, modern applications with power concerns, such as those in wireless communications, have more often used Viterbi decoders that implemented the TB method in their SPSUs, as Viterbi decoders using the TB method have lower power consumption and require only a limited memory bandwidth because the SPSU using the TB method only stores one copy of trace back bits for each state in the survivor path. However, the TB method requires higher decoder complexity in order to execute the recursive trace backs that reconstruct the entire survivor path to produce the entire decoded sequence.

In view of the foregoing, it would be desirable lower power consumption in Viterbi decoders.

SUMMARY

The present embodiments provide, among other features and benefits, a Viterbi decoder that lowers power consumption when executing the register exchange method in its Survivor Path Storage Unit. A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various embodiments may relate to a method for decoding a binary convolutional code using a Viterbi algorithm. The method may comprise producing a prediction sequence in a register. The production step may comprise decoding a series of output bits to produce a survivor path, re-encoding the survivor path as a survivor sequence, and subtracting the survivor sequence from a series of input bits. The method may also comprise decoding the prediction signal to produce a prediction path and adding the prediction path to the survivor path in the register.

Various embodiments may also relate to a method for decoding a binary convolutional code using a Viterbi algorithm. The method may comprise producing a plurality of preliminary decoded bits from bits from a plurality of survivor paths at a defined index. The method may also comprise delaying the plurality of preliminary decoded bits by one clock cycle. The method may also comprise subtracting the plurality of preliminary decoded bits from bits from the plurality of survivor paths at a target index, the target index immediately preceding the defined index.

Various embodiments may also relate to a storage unit to produce a binary convolutional code. The storage unit may comprise a register to produce a plurality of preliminary decoded bits from bits from a plurality of survivor paths at a defined index. The register may also delay the plurality of preliminary decoded bits by one clock cycle. The register may also subtract the plurality of preliminary decoded bits from bits from the plurality of survivor paths at a target index, the target index immediately preceding the defined index.

It should be apparent that, in this manner, various exemplary embodiments enable a Viterbi decoder that uses the register exchange method to consume less power when copying survivor paths than those in the prior art. The subtraction of a signal from its prediction signal may, on average, lower the variability, e.g., energy content, of the signal. In this manner, binary survivor path prediction symbols (i.e., bits) may be modulo-2 subtracted from binary survivor path symbol. Because the error prediction symbols have a small likelihood of being a high-energy bit, energy consumption may be reduced on average.

BRIEF DESCRIPTION OF THE DRAWINGS

In order to facilitate better understanding of various exemplary embodiments, reference is made to the accompanying drawings, wherein.

DETAILED DESCRIPTION

Figure 1A:
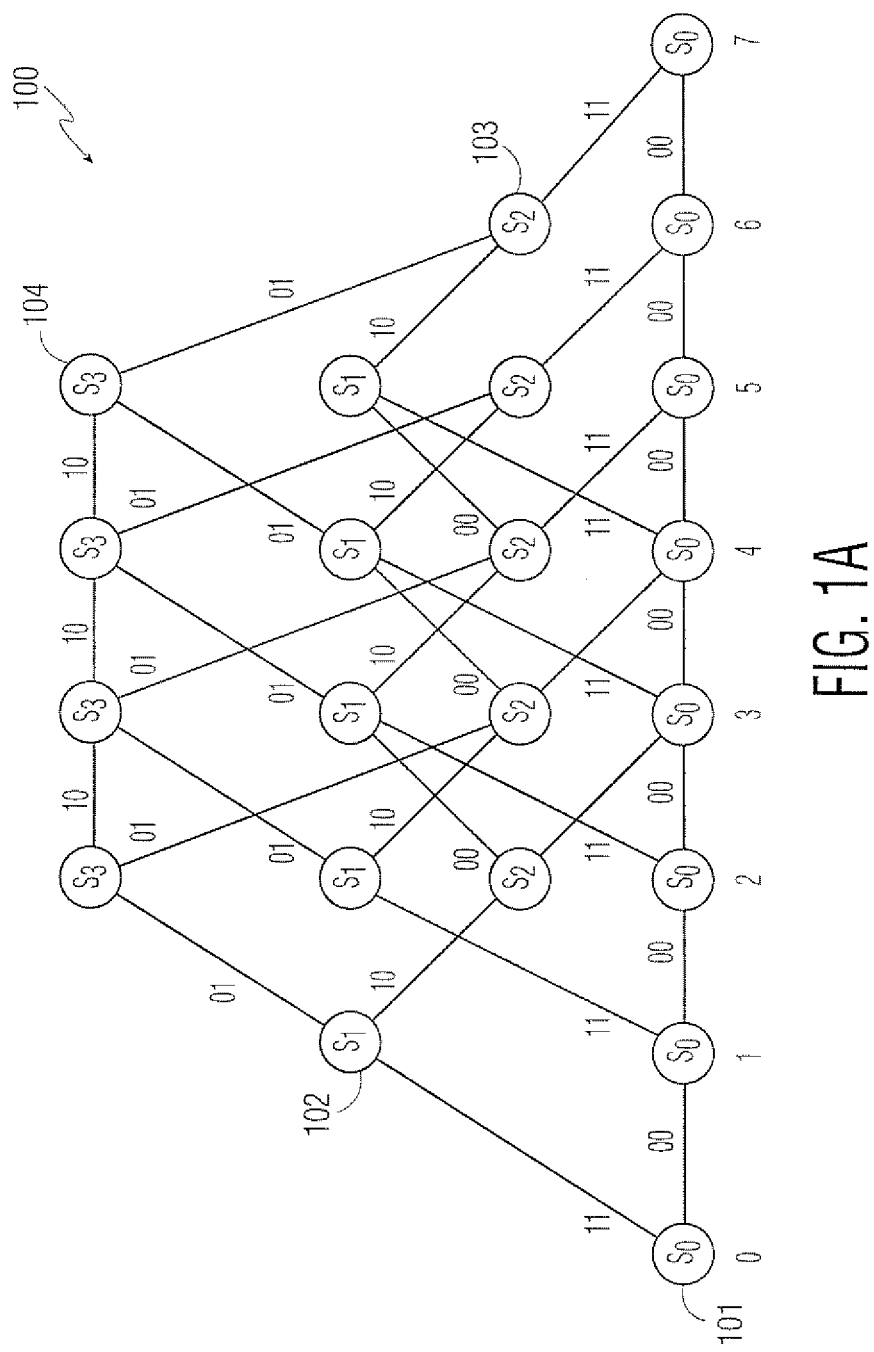
FIG. 1A is a trellis diagram of an exemplary binary convolutional code.

Referring now to the drawings, in which like numerals refer to like components or steps, there are disclosed broad aspects of various exemplary embodiments.

FIG. 1 is a trellis diagram of an exemplary binary convolutional code. A Viterbi decoder may receive input bits from binary convolutional codes. The binary convolutional code may be represented as (n, k, m), where a binary convolutional encoder produces n output bits by combining k input bits and the previous mk (where in is the memory order of the convolutional code) input bits. The Viterbi decoder may receive the binary convolutional code output sequence of n length, reconstruct, and output the k input bits of the original input sequence with a high probability. The possibilities of the binary convolutional code may be represented by a code tree that presents every codeword (i.e., code sequence) as a path on the tree. For example, an input sequence of L bits will have a corresponding code tree consisting of (L+m+1) levels, with the leftmost node at level 0 being the origin node and the rightmost nodes at level (L+m) being the terminal nodes. For the first L levels, there may be $2^k$ branches leaving each node. For nodes at levels L through (L+m), only one branch may leave from each node. Each path from the origin node to a terminal node may define a code path and may correspond to a distinct codeword. The codeword may form the output of the binary convolutional encoder for one period of its shift register.

Code trellis 100, therefore, is a corresponding structure that may be obtained from the code tree by merging all nodes in the same state. In the illustrated embodiment, code trellis 100 comprises a series of 8 levels that shows transitions between four states, $s_0$-$s_3$ 101-104. Due to the merging of nodes in the same state, only one terminal node may remain in a trellis, as all terminal nodes merge to the same, final state. Similarly, each path from the origin node to the terminal node may represent a distinct codeword. Accordingly, an s-level trellis may have $2^{s-1}$ paths and $2^{s-1}$ codewords. Each transition between states may possess a corresponding distance that may be defined as a branch metric. The Viterbi decoder may calculate the branch metrics of each state transition and store the paths that possess the shortest distances. These paths stored by the Viterbi decoder may be known as survivor paths.

Figure 1B:
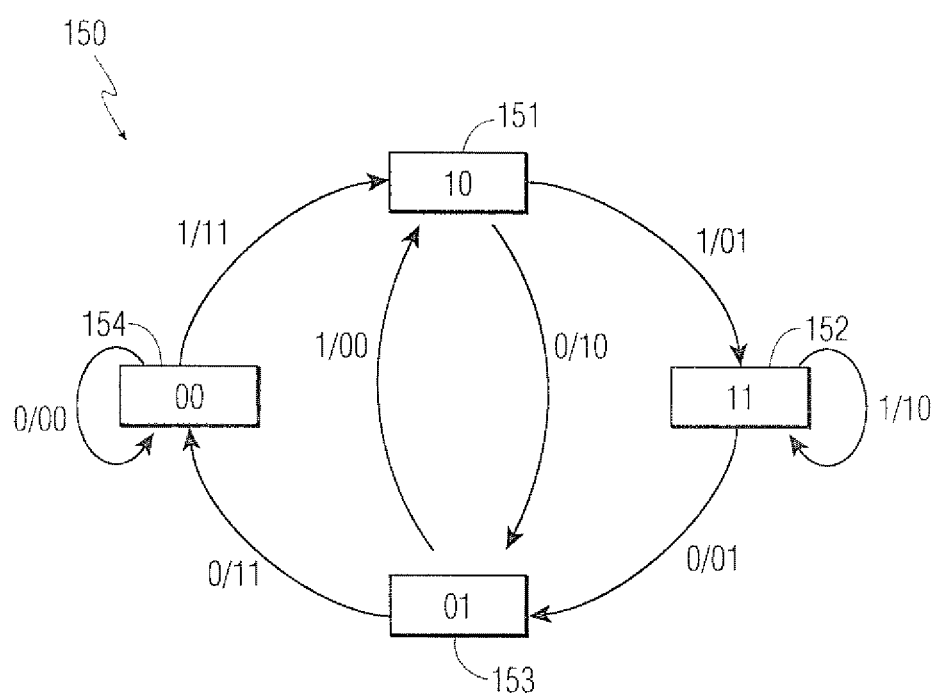
FIG. 1B is a state diagram of a corresponding exemplary binary convolutional encoder.

Referring now to FIG. 1B, a state diagram of a corresponding exemplary binary convolutional encoder is illustrated. A binary convolutional encoder (not shown) may be a device component that outputs a binary convolutional codeword. The convolutional codeword output of the binary convolutional encoder may be used, for example, as a component in an error correcting code. The binary convolutional encoder may include a plurality of shift registers and modulo-2 (mod-2) adders. The output bits of the binary convolutional encoder may be modulo-2 additions of selective shift register contents and present input bits. More general convolutional codes with a ratio of number of message bits to number of coded bits may be different from ½ and may have multiple input and output bits per trellis section.

The binary convolutional encoder may also be implemented as a finite state machine (FSM). In such an implementation, the contents of the shift registers may represent the states of the FSM. Therefore, the output of the FSM at a given time may depend on the current state of the machine. For the binary convolutional encoder, each change of state may be represented with the input of an input bit and the output of an output bit. FIG. 1B shows state diagram 150 of the binary convolutional encoder. State diagram 150 comprises a number of possible states 151-154, with state transitions between each state. Each possible state transition is labeled with the corresponding input and output (i.e., 0/11 represents input bit 0 and output bits 11). The trellis 100 of FIG. 1A may illustrate a number of possible state sequences for state diagram 150 of binary convolutional encoder when given a specific initial state. For example, if the initial state corresponds with state "01" 153, then $s_1$ at level 1 corresponds to state "00" 154 and $s_2$ at level 1 corresponds to state "10", respectively.

Figure 2:
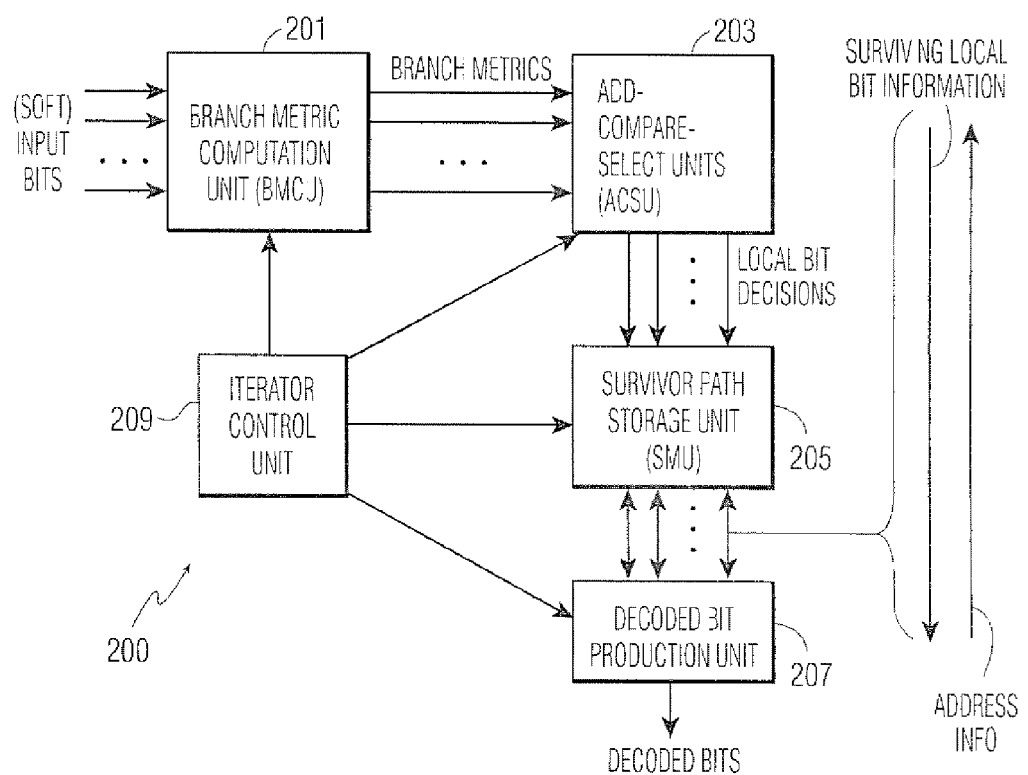
FIG. 2 is a functional block of an exemplary Viterbi decoder.

Referring now to FIG. 2, a functional block of an exemplary Viterbi decoder is illustrated. Viterbi decoder 200 may be a component of a computer system that decodes bit streams that were encoded with a binary convolutional codeword. Viterbi decoder 200 may contain various components shown in FIG. 2, in addition to other components not shown in FIG. 2, but that may be identified by a person of ordinary skill in the art upon reading this disclosure. According to one embodiment, the functional blocks forming the Viterbi decoder 200 may comprise a Branch Metric Computation Unit (BMCU) 201, an Add-Compare-Select Unit (ACSU) 203, a Survivor Path Storage Unit (SPSU) 205, a Decoded Bit Production Unit (DBPU) 207, and an Iterator Control Unit (ICU) 209. It will be understood that FIG. 2 is a functional diagram representing one example implementation of one Viterbi decoder 200 according to one embodiment; other hardware implementations may be different, yet contain the same functionality as that described and illustrated herein.

During an exemplary operation, Viterbi Decoder 200 may receive a series of input bits forming a binary convolutional codeword and decode the input bits using the Viterbi Algorithm to obtain with high probability the optimal survivor path representing the sequence that entered the binary convolutional encoder. More specifically, Branch Metric Computation Unit (BMCU) 201 may receive a series of input bits, starting with the terminal bit, and may calculate the corresponding branch metrics from these inputs. Add-Compare-Select Unit (ACSU) 203 may receive the plurality of branch metrics produced by BMCU 201 and recursively accumulate the branch metrics as path metrics for a plurality of possible paths through the trellis. ACSU 203 may then compare the accumulated path metrics with each other for a given level in the trellis and may make a decision, selecting the most likely state transition that would constitute an applicable survivor path. ACSU 103 may then generate decision bits corresponding to the chosen state transition. Survivor Path Storage Unit (SPSU) 205 may receive and store the decision bits from ACSU 103 to build the complete survivor path and may also produce surviving local bit information. DBPU 207 may receive the surviving local bit information and produce decoder output bits ("decoded bits") as an output, which may be in the form of a state sequence. DBPU 207 may also send address information back to SPSU 205.

Branch Metric Computation Unit 201 may calculate branch metrics associated with the possible distances between nodes on consecutive levels. More specifically, the branch metrics may be defined as a normalized distance between nodes in a trellis. As an example, BMCU 201 may calculate Hamming distances for the 11 and 00 transitions between level 7 and level 6 (shown in FIG. 1A) from state $s_0$ to states $s_2$ and $s_0$, respectively. The branch metrics may therefore represent the cost of traversing along a specific branch between nodes in the trellis. A hard decision Viterbi decoder may receive a simple bitstream on its input, with a Hamming distance used as a metric. Comparatively, a soft decision Viterbi decoder may receive a bitstream that also contains information regarding the reliability of each received symbol, with the squared Euclidean distance used as a metric for the soft decision Viterbi decoder. BMCU 201 may calculate new branch metrics for each input bit during every clock cycle, as during each clock cycle, BMCU 201 may receive a new input bit that represents a new level in the trellis.

Add-Compare-Select Unit (ACSU) 203 may accumulate the branch metrics received from BMCU 201 to get metrics in the form of path metrics for a plurality of paths through the trellis. Path metrics, also known as state metrics, may collect the total minimum cost of arriving into a specific state from an initial state, which may be the sum of consecutive branch metrics. Such a cost function may be in the form of a function of the decreasing likelihood of the path between the initial state and the specific state. A commonly-used function in implementation for such a function of the likelihood may be the logarithmic or log-likelihood function. The Add-Compare-Select (ACS) algorithm in ACSU 203 may update the path metrics recursively. The ACS algorithm updates recursively by adding branch metrics to the path metrics of the previous time instant. For example, during every clock cycle, ACSU 203 may update the plurality of path metrics through the receipt of branch metrics from BMCU 201. For example, after receiving branch metrics for level 5, ACSU 203 may append the branch metrics of the new level to a stored path metric. For example, if ACSU 203 previously decided on the "11" branch from the terminal state, ACSU 203 may add distances associated with the "01" and "10" branches to the stored path metric.

Once the path metrics are appended, ACSU 203 may then compare the outcomes of the two appended paths. ACSU 203 may compare the path metrics of the two paths by conducting a subtraction of the two candidate path metrics, with the most significant bit of the difference pointing to a larger one of the two. For example, if the "10" transition has a shorter distance, the path metric will be smaller, as the two path metrics may be identical, except for the appended branch metric. After performing a subtraction from the other path metric with the "01" transition, the other path metric may contain the most significant bit. This may serve as a signal to indicate that ACSU 203 should select the path metric containing the "10" transition.

Finally, ACSU 203 may then select the path with the minimum overall distance. When making a selection decision during a given clock cycle, ACSU 203 may discard non-optimal paths and output the chosen path to SPSU 205. For example, when the "10" branch is the shortest distance, ACSU 203 may select its associated path as the survivor path. The smaller path metric of the two is selected to be the new path metric (i.e., survivor path) for a given state. When all the input data is processed through BMCU 201 and ACSU 203, the complete minimum path metric outputted may be the complete survivor path that represents the best-likelihood estimation of the input sequence into the binary convolutional encoder. Recursively tracing backwards along the trellis of state transitions used by the binary convolutional encoder, the survivor path constructed by the ACSU 203 may represent the likely sequence of transmitted data as it entered the binary convolutional encoder.

SPSU 205 may receive from ACSU 203 information that represents the current selected minimum metric path. Though theoretically requiring the entire input sequence, in practice, paths through the trellis generally merge to a common survivor path after a number of iterations. From the point that multiple paths merge to the terminal state, however, the decoding is still unique. The depth at which all the survivor paths merge with high probability is defined as the survivor path length.

SPSU 205, as will be discussed below in relation to FIG. 3, may use a plurality of methods to update the survivor path to reflect the added information presented by ACSU 203. For example, when SPSU 205 uses the trace back method, ACSU 203 may present a trace back bit to indicate the path chosen, with the survivor path merely storing a collection of these trace back bits in sequence. In contrast, when SPSU 205 uses the register exchange method, SPSU 205 updates the survivor path by copying the entire survivor path, appending the bit corresponding to the chosen state and when the survivor path is at its discrete length limit, removing the oldest bit. SPSU 205 may then forward the surviving local bit information in the form of the abridged survivor path or the survivor path comprised of trace back bits to DBPU 207.

Decoded Bit Production Unit (DBPU) 207 may receive the surviving local bit information and may use this information to output decoded output bits ("decoded bits"). DBPU 207 may also forward to SPSU 205 address information.

Iterator Control Unit (ICU) 209 may control BMCU 201, ACSU 203, SPSU 205, and DBPU 207 through a plurality of control signals.

Figure 3:
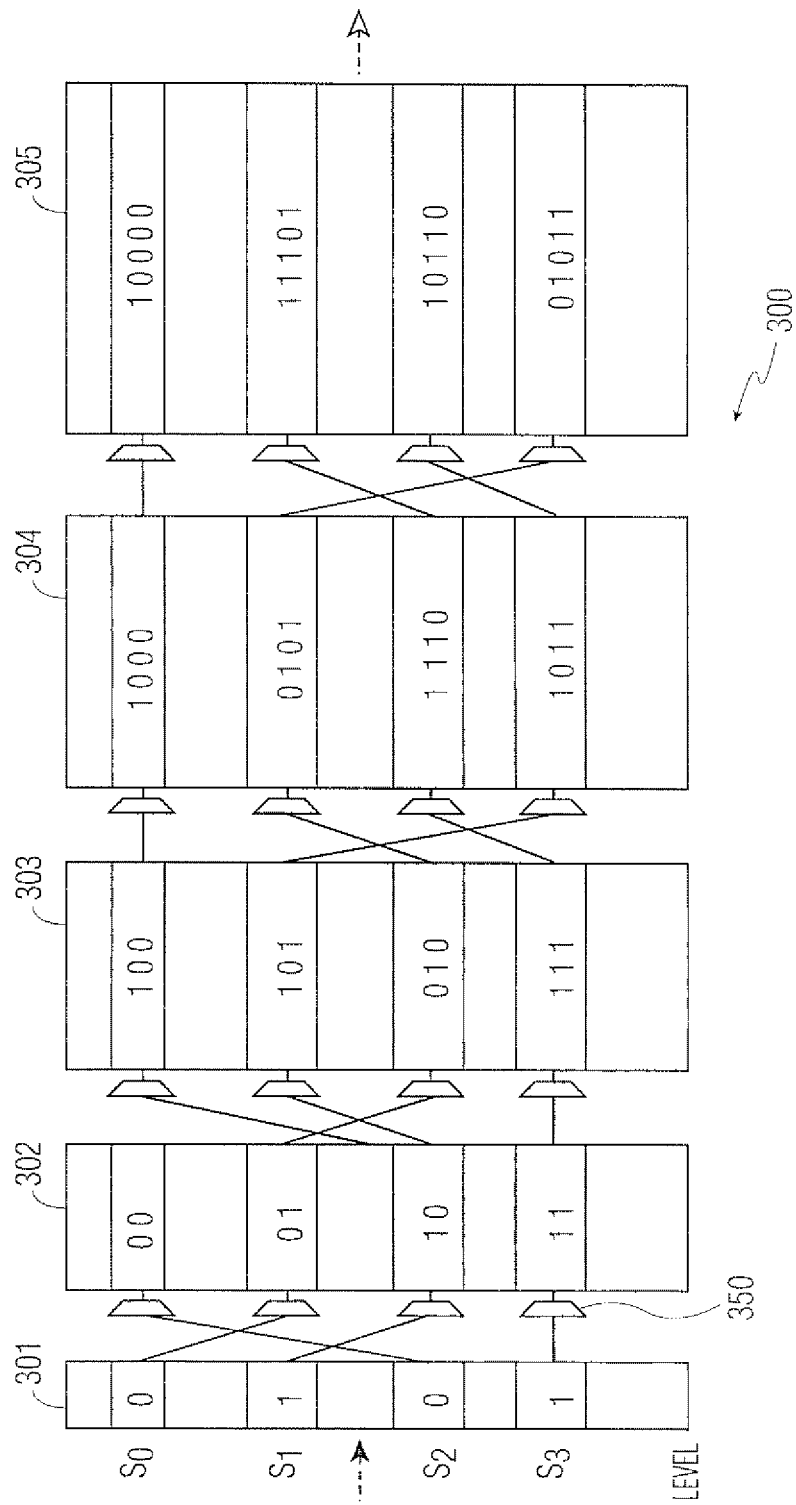
FIG. 3 is a functional block of an exemplary Survivor Path Storage Unit implementing a register exchange method.

Referring now to FIG. 3, a functional block of an exemplary Survivor Path Storage Unit 300 implementing a register exchange method is illustrated. In the illustrated embodiment, SPSU 300 contains a series of path register columns 301-305, and an array of multiplexers 350 (only one of which has been labeled, for clarity). In the illustrated embodiment, the array of multiplexers and registers may be connected to resemble trellis 100 of the binary convolutional encoder. In the array, a register may be assigned to each state at each level. For example, for Level 2 at path register column 301, there may be four registers for states $s_0$-$s_3$. SPSU 300 may use a series of registers through register columns 301-305 to record the decoded output sequence produced from ACSU 203 along a path from the initial state to the final state. At the last stage, the decoded output sequence may be the one stored as the complete survivor path, representing the minimum path metric.

The depth of the array of multiplexers and registers may be five times larger than the value of the constraint length x in order to prevent significant performance degradation. A person of skill in the art would know of other depths to prevent performance degradation (e.g., a depth twelve times larger than the constraint length). The exact value may be chosen based on factors such as the amount of error correction performance required, the type of communications channel used, the type of interleaver being used and the implementation complexity of the Viterbi algorithm. Turning to the survivor path, the exemplary trellis of FIG. 1 is for a constraint length equal to 3. There may therefore be 15 levels in order to prevent significant performance degradation. The size of registers increases through consecutive register columns 301-305 to account for the appended bits used to construct the survivor paths. Multiplexers 350 may be connected to the input of each register in register columns 301-305. Multiplexers 350 may be used to connect multiple registers to the input of a given register. In the illustrated embodiment, the illustrated lines represent the chosen input for a register in register paths 302-305.

During regular operation, a register in register column 302-305 may copy the entire contents of a register in the previous register column 301-304. For example, the register for $s_2$ in register column 304 may copy "111" from the $s_3$ register in register column 303. The $s_2$ register in register column 304 may then append the decoded bit received from ACSU 203 to the end to create the new survivor path "1110". This process may continue from the initial state to the terminal state until a complete survival path is produced. Because a register in register column 301-304 may possibly input into multiple registers in the subsequent register column 302-305, SPSU 300 may contain $2^{x-1}$ states at each stage. For example, FIGS. 1A-1B illustrate trellis and state diagrams for a binary convolutional encoder of constraint length 3. SPSU 300 may therefore contain $2^{3-1}=2^2=4$ states, and therefore 4 registers, at each stage.

Figure 4:
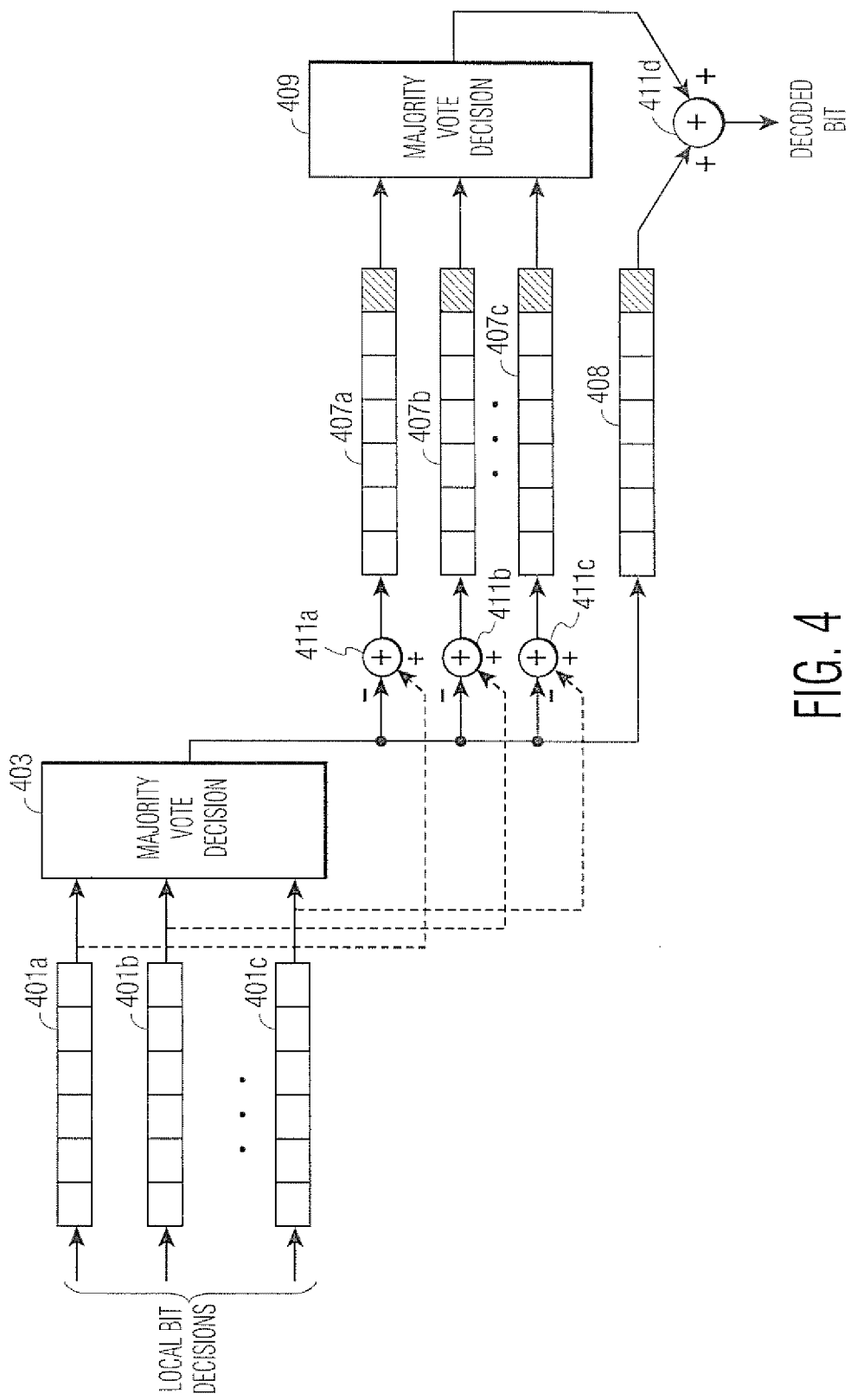
FIG. 4 is a functional block of an exemplary Survivor Path Storage Unit implementing an alternative register exchange method.

Referring now to FIG. 4, a functional block of an exemplary Survivor Path Storage Unit 400 implementing another register exchange method is illustrated. SPSU 400 of the illustrated embodiment functions in a similar manner to SPSU 300 of FIG. 3 by using the register exchange method to save new data for survivor paths. However, SPSU 400 may have additional stages that may further reduce power consumption. This may involve the use of several techniques that ultimately result in a vast majority of saved bits past a certain depth being low-energy bits (i.e., a logical "0"). As a result, SPSU 400 may consume substantially less power when copying survivor paths while appending the new information received from ACSU 203.

In the illustrative embodiment, SPSU 400 contains a plurality of survivor paths 401a-c and a majority vote decision component 403. In addition, SPSU 400 also contains a plurality of differential survivor paths 407a-c, shift register 408, a second majority vote decision component 409, and a plurality of adders 411a-411d.

In the illustrated embodiment, SPSU 400 may employ an algorithm to limit the scope of searches used to build the complete survivor paths and therefore, the number of survivor paths 401a-c saved in SPSU 400 at a given time. Viterbi decoder 200 may conduct a limited search algorithm, where certain paths are purged in lieu of computing and keeping $2^{x-1}$ states at each stage, where x is the constraint length of the convolutional codeword. For example, during the decoding stage in ACSU 203 of a Viterbi decoder using the limited search algorithm, only some of the most likely paths with the accumulative path metric satisfying a certain preset threshold from the best path metric are kept by SPSU 205. This comparison to threshold may be done by ACSU 203 before reaching SPSU 205. As a result, SPSU 400 may store and update fewer survivor paths than are theoretically necessary. This may result in a large reduction of computation in ACSU 203, while only resulting in a small increase in degradation.

SPSU 400 may also offer low power consumption due the properties of the communications channel on which it receives the convolutional codes. When there are few channel errors, vector bits from the survivor path at a given index (i.e., column of bits) may be converging to either a "0" or "1" logical value. As a result of this convergence, a most of the collection of bits at a given index may likely be equal to one value, with a majority vote estimating that value. For example, if a majority vote at an index predicts that all values at the index to equal to a logical "0", this may substitute for all the values at the given index with high accuracy if, for example, there is a 0.95 probability of a bit at the index being a logical "0". Accordingly, in this example, the probability of the survivor bit at the given index taking on the minority value would be 0.05. As a result, the modulo-2 subtraction of the majority vote bit from the actual values in the survivor path may make the majority of bits a logical "0".

SPSU 400 may therefore produce a prediction sequence from the survivor paths by first producing a majority vote bit by conducting a majority vote on the bits of the survivor paths at a certain index. For example, the last bits of survivor paths 401a-c, which are at the same index known as the defined index, may act as inputs into majority vote decision component 403. Similarly, the last bits of differential survivor paths 407a-c at the reference index may act as inputs into second majority vote decision component 409. Alternative embodiments may include additional majority vote decision components.

If the number of bits with a logical "1" value at the defined and reference indices is a majority, then majority vote decision components 403, 409 may produce a majority vote bit in line with the majority of survivor bits at the defined and reference indices. Consequently, all the bits at the defined and reference indices may be converted to high-energy bits. Conversely, if the majority consists of bits with a logical "0" value, then all the bits at the defined and reference indices may be converted to low-energy bits. Majority vote decision components 403, 409 may make an arbitrary decision when the numbers of bits containing "0"s and "1"s are equal. A preliminary decoded bit may be defined as the majority decision bit of majority vote decision component 403 produced from the bits at the defined index, while the final decision bit may be defined as the majority decision bit of majority vote decision component 409 produce from the bits at the reference index. Alternative embodiments may produce additional majority decision bits (e.g., second decision bit) from the additional majority vote decision components at additional indices. A person of ordinary skill knows of alternative methods to compute the decoded output bits. For example, one method may involve using the oldest bit of the survivor path with the best path metric among the survivor paths at a given level, using the oldest bit of an arbitrary survivor path, or using the oldest bit of a survivor path of an arbitrary state.

The majority vote bit may then substitute for the bits in each survivor path at the index used by the majority vote decision component. This final result may be known as the prediction sequence. For example, the last bits of survivor paths 401a-c at the defined index all contain the same preliminary bit. This column of bits at the defined index may be subtracted from bits at the index immediately preceding the defined index in the processing history. The difference between the two bits may be defined as the prediction error bit. SPSU 400 may append a series of prediction error bits to produce differential survivor paths 407a-c. Alternative embodiments may produce high-order differential survivor paths by using the differential survivor paths with additional majority vote decision components before the reference index.

At the reference index, the final decision bit may also substitute into the bits of each differential survivor path 407a-c. The column of bits at the reference index may be subtracted from bits at the index immediately preceding the defined index in the processing history. This may produce a reference bit.

The output of majority vote decision 403 may then be delayed by one clock cycle by entering the preliminary decoded bit into shift register 408. The delayed preliminary decoded bit may be added to the reference bit to produce the final decoded bit. The resultant column of bit values in the resultant differential survivor paths 407a-c may likely be a column of zero values. As more bits are appended to the end of survivor paths 407a-c, columns of the same logical value propagate through the plurality of differential survivor paths 407a-c due to the production of prediction signals by majority vote decision component 403. Due to the property of most bits converging to a logical "0", at a certain intermediate index of the survivor path 401a-c, the value of a preliminary decoded bit will most likely be a low-energy bit. This may result in a majority of each differential survivor path 407a-c consisting almost exclusively of low-energy bits before a certain index in the combined survivor paths 401a-c and differential survivor path 407a-c.

In the preceding example, a high-energy bit may be defined in the binary context as a bit having a logical value equal to "1", which may be associated with a higher voltage (and therefore, power). In contrast, a low-energy bit may be defined in the binary context as a bit having a logical value equal to "0", which may be associated with a lower voltage (and power).

The use of the majority vote decision in SPSU 400 to produce low-energy bits may result in a great reduction in power consumption in a number of contexts. For example, power consumption may be lowered as a result of how bits are overwritten in the register when copying the entire survivor paths. For example, in some integrated circuits, writing zero bit values into a register that already contains a zero bit value from a previous iteration may consume a specific amount of power. This amount of power may be an order of magnitude less than the power consumption in an integrated circuit that, for example, writes either a new "0" or "1" bit with 50%/50% likelihood ("50/50 bit") into a register that already contains a 50/50 bit value from a previous iteration, resulting in a change in the bit value; this overwritten circuit may be defined as a "change-bit" circuit. The specified amount of power in writing a zero bit value over an existing zero bit value may also be at least an order of magnitude less than the power consumption in an integrated circuit that, for example, overwrites a new bit into a register that already contains a "1" bit from a previous iteration, resulting in overwriting a high-energy bit; this overwritten circuit may be defined as a "high-bit" circuit.

Figure 5:
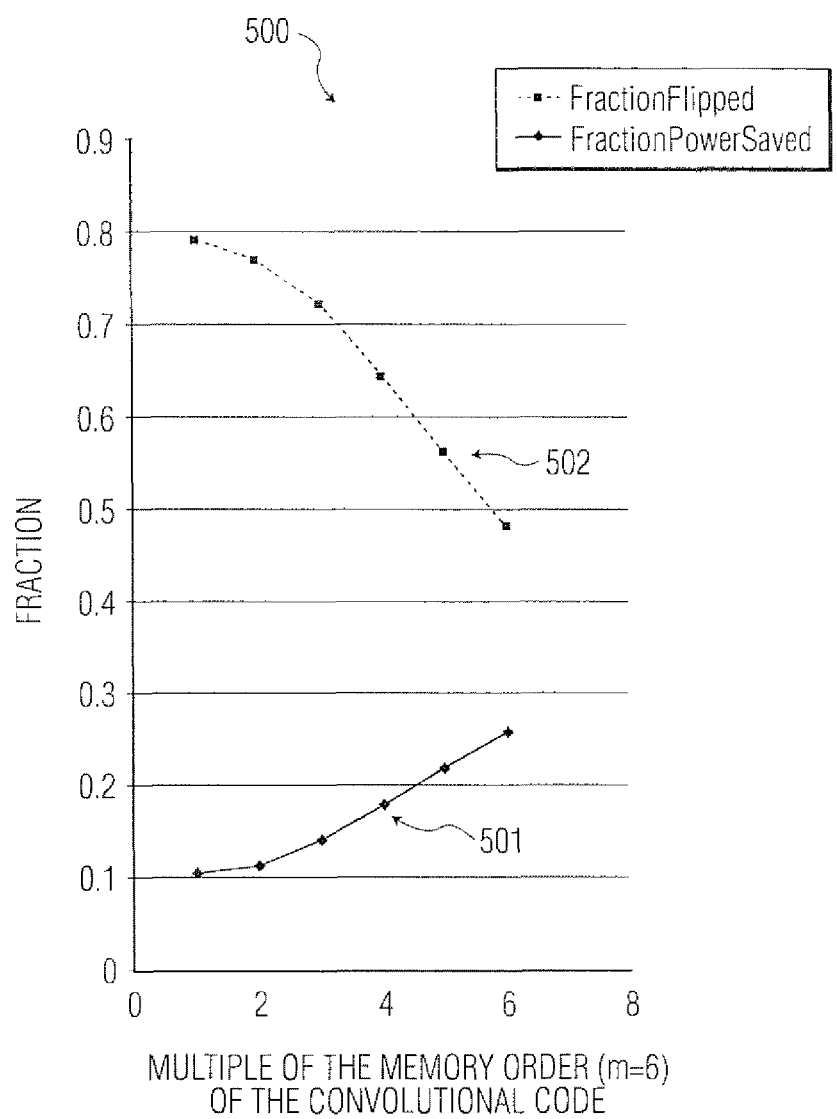
FIG. 5 is a graph illustration the relation between the location of the defined index and the relative value of power saved.

Referring now to FIG. 5, a graph showing the relation between the location of the defined index and the relative value of power saved is illustrated. If the defined index used to calculate the preliminary decoded bit is close to the reference index, the prediction sequence is calculated deeper in the processing history. Therefore, the likelihood that all survivor bits at the defined index are the same value may be overwhelming; additionally, there is a higher probability that the differential survivor bits are low-energy bits. However, as the reference index is the index for the oldest survivor path bit stored, the modulo-2 subtracted components that comprise the differential survivor path may only constitute a small portion of the entire survivor path, so there may not be an appreciable savings in power consumption. On the other hand, if the defined index is shallower in processing history, the number of bits in the index differing from the majority will be non-negligible, so more power may be consumed in changing the bit. However, the early change may consume less power overall, as a larger portion of the differential survivor path may consist of low-energy bits.

The graph 500 includes both line 501, tracing the fraction of bits changed by majority vote compared to the depth of the defined index, and line 502, tracing the fraction of power saved compared to the depth of the defined index, in the illustrated embodiment, the memory order in is equal to 6. The x-axis scale indicates in a scale of the memory order, the distance of the defined index from the reference index. As shown on line 501, as the defined index moves away from the reference index to later bits in the processing history, the number of changed bits increases. However, as the defined index moves away from the reference index in the processing history, the total amount of power saved also decreases. This may mainly be due to the increased fraction of bit changes.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications may be implemented while remaining within the spirit and scope of the invention. Accordingly, the foregoing disclosure, description, and figures are for illustrative purposes only and do not in any way limit the invention, which is defined only by the claims.

What is claimed is:

1. A method for decoding a binary convolutional code using a Viterbi algorithm, said method comprising:
   producing a prediction sequence in at least one register, the producing step comprising:
      concatenating a series of add-compare-select (ACS) bits to produce a plurality of survivor paths,
      estimating an estimated survivor path symbol at a defined index, the survivor path symbol being the result of values of symbols in the plurality of survivor paths at the defined index, and
      substituting the values of symbols in the plurality of survivor paths at the defined index with the estimated survivor path symbol;
   computing a plurality of differential survivor paths, the plurality of differential survivor paths being the result of subtracting the prediction sequence from the survivor path at the defined index; and
   storing the plurality of differential survivor paths in the at least one register.

2. A method for decoding a binary convolutional code using a Viterbi algorithm, said method comprising:
   producing a preliminary decoded bit from bits of a plurality of survivor paths at a defined index, the defined index being at a different depth in processing history than a reference index; and
   subtracting the preliminary decoded bit from bits of the plurality of survivor paths at a target index to produce a plurality of prediction error bits, the target index immediately preceding the defined index.

3. The method of claim 2, wherein the producing step further comprises:
   comparing bits of the plurality of survivor paths at the defined index by a majority vote.

4. The method of claim 3, wherein the producing step further comprises:

specifying the preliminary decoded bit as a logical "1" when a majority of bits of the plurality of survivor paths at the defined index are a logical "1" value.

5. The method of claim 2, further comprising:
generating a final decision bit from bits of a plurality of survivor paths at the reference index;
delaying the preliminary decoded bit by one clock cycle; and
generating a final decoded bit from the preliminary decoded bit and the final decision bit.

6. The method of claim 5, wherein the defined index is at a smaller depth in processing history than the reference index.

7. The method of claim 6, further comprising:
producing a second preliminary decoded bit from bits of a plurality of survivor paths at an intermediate index, the intermediate index at a greater depth in processing history than the defined index and a smaller depth in processing history than the reference index; and
subtracting the second preliminary decoded bit from bits of the plurality of survivor paths at a second target index to produce a plurality of intermediate prediction error bits, the second target index immediately preceding the intermediate index.

8. The method of claim 6, further comprising:
subtracting the preliminary decoded bit from bits of the plurality of survivor paths at the target index before generating the final decision bit.

9. The method of claim 6, further comprising:
subtracting the preliminary decoded bit from bits of the plurality of survivor paths at the target index after generating the final decision bit.

10. The method of claim 5, wherein the delaying step further comprises:
entering the preliminary decoded bit into a shift register.

11. A storage unit to produce a binary convolutional code, the storage unit comprising:
at least one register configured and arranged to:
produce a preliminary decoded bit from bits of a plurality of survivor paths at a defined index, the defined index being at a different depth in processing history than a reference index; and
subtract the preliminary decoded bit from bits of the plurality of survivor paths at a target index to produce a plurality of prediction error bits, the target index immediately preceding the defined index.

12. The storage unit of claim 11, wherein the at least one register produces the preliminary decoded bit by comparing bits of the plurality of survivor paths at the defined index by a majority vote.

13. The storage unit of claim 12, wherein the at least one register specifies the preliminary decoded bit as a logical "1" when a majority of bits of the plurality of survivor paths at the defined index are a logical "1" value.

14. The storage unit of claim 11, wherein the at least one register:
generates a final decision bit from bits of the plurality of survivor paths at the reference index;
delays the preliminary decoded bit by one clock cycle; and
generates a final decoded bit from the preliminary decoded bit and the final decision bit.

15. The storage unit of claim 14, wherein the defined index is at a smaller depth in processing history than the reference index.

16. The storage unit of claim 14, wherein the at least one register further:
produces a second preliminary decoded bit from bits of a plurality of survivor paths at a intermediate index, the intermediate index at a greater depth in processing history than the defined index and a smaller depth in processing history than the reference index; and
subtracts the second preliminary decoded bit from bits of the plurality of survivor paths at a second target index to produce a plurality of intermediate prediction error bits, the second target index immediately preceding the intermediate index.

17. The storage unit of claim 15, wherein the at least one register subtracts the preliminary decoded bit from bits of the plurality of survivor paths at the target index before generating the final decoded bit.

18. The storage unit of claim 15, wherein the at least one register subtracts the preliminary decoded bit from bits of the plurality of survivor paths at the target index after generating the final decoded bit.

19. The storage unit of claim 11, further comprising:
a shift register to store the preliminary decoded bit produced by the at least one register.

20. The storage unit of claim 19, wherein the shift register store the preliminary decoded bit for one clock cycle.

21. The method of claim 1, wherein the subtracting of the prediction sequence from the survivor path includes modulo-2 subtraction.

22. The method of claim 1, wherein the subtracting of the prediction sequence from the survivor path reduces energy consumption of the decoding.

23. The method of claim 1, wherein the subtracting of the prediction sequence from the survivor path includes subtracting from bits at an index immediately preceding the defined index in a processing history.

24. The method of claim 1, wherein the step of storing the plurality of differential survivor paths in the at least one register includes a decoded output sequence.

25. The method of claim 1, wherein the step of storing the plurality of differential survivor paths in the at least one register includes a decoded output sequence representing a minimum path metric.

26. The method of unit of claim 2,
further comprising:
producing the plurality of survivor paths by concatenating a series of add-compare-select (ACS) bits,
estimating an estimated survivor path symbol at a defined index based on values of symbols in the plurality of survivor paths at the defined index, and
producing a prediction sequence by substituting the values of symbols in the plurality of survivor paths at the defined index with the estimated survivor path symbol, and
wherein
producing the preliminary decoded bits of a plurality of survivor paths includes producing the preliminary decoded bits from the differential survival paths, and
subtracting the preliminary decoded bit from bits of the plurality of survivor paths at a target index to produce a plurality of prediction error bits includes computing a plurality of differential survivor paths by subtracting the prediction sequence from the survivor path at the defined index.

27. The storage unit of claim 11, wherein the at least one register is configured and arranged to produce the plurality of survivor paths by concatenating a series of add-compare-select (ACS) bits,
estimate an estimated survivor path symbol at a defined index based on values of symbols in the plurality of survivor paths at the defined index, produce a prediction sequence by substituting the values of symbols in the plurality of survivor paths at the defined index with the estimated survivor path symbol, produce the preliminary decoded bits of a plurality of survivor paths by producing the preliminary decoded bits from the differential survival paths, and subtract the preliminary decoded bit from bits of the plurality of survivor paths at a target index to produce a plurality of prediction error bits by computing a plurality of differential survivor paths by subtracting the prediction sequence from the survivor path at the defined index.

28. The storage unit of claim 11, wherein the at least one register is configured and arranged to produce a second preliminary decoded bit from bits of a plurality of survivor paths at an intermediate index, the intermediate index being at a greater depth in processing history than the defined index and at a smaller depth in processing history than the reference index; and subtracting the second preliminary decoded bit from bits of the plurality of survivor paths at a second target index to produce a plurality of intermediate prediction error bits, the second target index immediately preceding the intermediate index.

* * * * *